US008734583B2

(12) United States Patent
Forbes

(10) Patent No.: US 8,734,583 B2
(45) Date of Patent: *May 27, 2014

(54) GROWN NANOFIN TRANSISTORS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 1298 days.

This patent is subject to a terminal disclaimer.

(21) Appl. No.: 11/397,430

(22) Filed: Apr. 4, 2006

(65) Prior Publication Data

US 2007/0231985 A1 Oct. 4, 2007

(51) Int. Cl.
*C30B 1/00* (2006.01)

(52) U.S. Cl.
USPC ............ 117/9; 117/4; 117/7; 117/8; 117/930; 438/96; 438/301; 438/365; 438/482; 257/67; 257/270; 257/302; 257/618

(58) Field of Classification Search
USPC ............ 117/4, 7, 8, 9, 930; 438/96, 301, 365, 438/482; 257/67, 270, 302, 618
See application file for complete search history.

(56) References Cited

U.S. PATENT DOCUMENTS

| | | | |
|---|---|---|---|
| 4,941,026 A | 7/1990 | Temple | |
| 5,013,680 A | 5/1991 | Lowrey et al. | |
| 5,545,586 A | 8/1996 | Koh | |
| 5,646,900 A | 7/1997 | Tsukude et al. | |
| 5,909,618 A | 6/1999 | Forbes et al. | |
| 5,982,162 A | 11/1999 | Yamauchi | |
| 6,063,688 A | 5/2000 | Doyle et al. | |
| 6,097,065 A | 8/2000 | Forbes et al. | |
| 6,104,061 A | 8/2000 | Forbes et al. | |
| 6,104,068 A | 8/2000 | Forbes | |
| 6,150,687 A | 11/2000 | Noble et al. | |
| 6,177,299 B1 | 1/2001 | Hsu et al. | |
| 6,191,448 B1 | 2/2001 | Forbes et al. | |

(Continued)

FOREIGN PATENT DOCUMENTS

CN ZL200780011084.7 9/2012
DE 19943390 A1 5/2001

(Continued)

OTHER PUBLICATIONS

Adler, E., et al., "The Evolution of IBM CMOS DRAM Technology", *IBM Journal of Resesarch & Development*, 39(1-2), (Jan.-Mar. 1995),167-188.

(Continued)

*Primary Examiner* — Matthew Song
(74) *Attorney, Agent, or Firm* — Schwegman, Lundberg & Woessner, P.A.

(57) ABSTRACT

One aspect of the present subject matter relates to a method for forming a transistor. According to an embodiment, a fin of amorphous semiconductor material is formed on a crystalline substrate, and a solid phase epitaxy (SPE) process is performed to crystallize the amorphous semiconductor material using the crystalline substrate to seed the crystalline growth. The fin has a cross-sectional thickness in at least one direction less than a minimum feature size. The transistor body is formed in the crystallized semiconductor pillar between a first source/drain region and a second source/drain region. A surrounding gate insulator is formed around the semiconductor pillar, and a surrounding gate is formed around and separated from the semiconductor pillar by the surrounding gate insulator. Other aspects are provided herein.

20 Claims, 13 Drawing Sheets

(56) References Cited

U.S. PATENT DOCUMENTS

| | | | |
|---|---|---|---|
| 6,238,976 B1 | 5/2001 | Noble et al. | |
| 6,320,222 B1 | 11/2001 | Forbes et al. | |
| 6,350,635 B1 | 2/2002 | Noble et al. | |
| 6,355,961 B1 | 3/2002 | Forbes | |
| 6,376,317 B1 | 4/2002 | Forbes et al. | |
| 6,377,070 B1 | 4/2002 | Forbes | |
| 6,399,979 B1 | 6/2002 | Noble et al. | |
| 6,413,802 B1 * | 7/2002 | Hu et al. | 438/151 |
| 6,413,825 B1 | 7/2002 | Forbes | |
| 6,414,356 B1 | 7/2002 | Forbes et al. | |
| 6,424,001 B1 | 7/2002 | Forbes et al. | |
| 6,448,601 B1 | 9/2002 | Forbes et al. | |
| 6,492,233 B2 | 12/2002 | Forbes et al. | |
| 6,496,034 B2 | 12/2002 | Forbes et al. | |
| 6,504,201 B1 | 1/2003 | Noble et al. | |
| 6,531,727 B2 | 3/2003 | Forbes et al. | |
| 6,559,491 B2 | 5/2003 | Forbes et al. | |
| 6,566,682 B2 | 5/2003 | Forbes | |
| 6,639,268 B2 | 10/2003 | Forbes et al. | |
| 6,649,476 B2 | 11/2003 | Forbes | |
| 6,653,174 B1 | 11/2003 | Cho et al. | |
| 6,664,806 B2 | 12/2003 | Forbes et al. | |
| 6,720,216 B2 | 4/2004 | Forbes | |
| 6,747,313 B1 | 6/2004 | Gil | |
| 6,762,448 B1 * | 7/2004 | Lin et al. | 257/302 |
| 6,801,056 B2 | 10/2004 | Forbes | |
| 6,818,937 B2 | 11/2004 | Noble et al. | |
| 6,855,582 B1 | 2/2005 | Dakshina-Murthy et al. | |
| 6,881,627 B2 | 4/2005 | Forbes et al. | |
| 6,890,812 B2 | 5/2005 | Forbes et al. | |
| 6,894,532 B2 | 5/2005 | Forbes et al. | |
| 6,903,367 B2 | 6/2005 | Forbes | |
| 6,946,879 B2 | 9/2005 | Forbes | |
| 6,964,903 B2 | 11/2005 | Forbes | |
| 7,120,046 B1 | 10/2006 | Forbes | |
| 7,326,611 B2 | 2/2008 | Forbes | |
| 7,371,627 B1 | 5/2008 | Forbes | |
| 7,425,491 B2 * | 9/2008 | Forbes | 438/301 |
| 7,439,576 B2 | 10/2008 | Forbes | |
| 7,446,372 B2 | 11/2008 | Forbes | |
| 7,491,995 B2 | 2/2009 | Forbes | |
| 8,062,949 B2 | 11/2011 | Forbes | |
| 8,119,484 B2 | 2/2012 | Forbes | |
| 8,134,197 B2 | 3/2012 | Forbes | |
| 8,354,311 B2 | 1/2013 | Forbes | |
| 2002/0028541 A1 | 3/2002 | Lee et al. | |
| 2002/0060338 A1 | 5/2002 | Zhang | |
| 2002/0177265 A1 | 11/2002 | Skotnicki et al. | |
| 2003/0006410 A1 | 1/2003 | Doyle | |
| 2003/0008515 A1 | 1/2003 | Chen et al. | |
| 2003/0227072 A1 | 12/2003 | Forbes | |
| 2004/0007721 A1 | 1/2004 | Forbes et al. | |
| 2004/0108545 A1 | 6/2004 | Ando | |
| 2004/0174734 A1 | 9/2004 | Forbes | |
| 2004/0217391 A1 | 11/2004 | Forbes | |
| 2004/0219722 A1 | 11/2004 | Pham et al. | |
| 2004/0235243 A1 | 11/2004 | Noble et al. | |
| 2005/0023616 A1 | 2/2005 | Forbes | |
| 2005/0032297 A1 | 2/2005 | Kamins | |
| 2005/0190617 A1 | 9/2005 | Forbes et al. | |
| 2006/0043471 A1 | 3/2006 | Tang et al. | |
| 2006/0046200 A1 | 3/2006 | Abatchev et al. | |
| 2006/0046391 A1 | 3/2006 | Tang et al. | |
| 2006/0046424 A1 | 3/2006 | Chance et al. | |
| 2006/0063350 A1 | 3/2006 | Chance et al. | |
| 2006/0076625 A1 * | 4/2006 | Lee et al. | 257/353 |
| 2006/0258119 A1 | 11/2006 | Wells | |
| 2006/0278910 A1 | 12/2006 | Forbes | |
| 2007/0018206 A1 | 1/2007 | Forbes | |
| 2007/0052012 A1 | 3/2007 | Forbes | |
| 2007/0082448 A1 | 4/2007 | Kim et al. | |
| 2007/0228433 A1 | 10/2007 | Forbes | |
| 2007/0228491 A1 | 10/2007 | Forbes | |
| 2007/0231980 A1 | 10/2007 | Forbes | |
| 2007/0232007 A1 | 10/2007 | Forbes | |
| 2008/0315279 A1 | 12/2008 | Forbes | |
| 2009/0155966 A1 | 6/2009 | Forbes | |
| 2010/0055917 A1 | 3/2010 | Kim | |
| 2010/0330759 A1 | 12/2010 | Forbes | |
| 2012/0119279 A1 | 5/2012 | Forbes | |
| 2012/0168855 A1 | 7/2012 | Forbes | |
| 2013/0112982 A1 | 5/2013 | Forbes et al. | |

FOREIGN PATENT DOCUMENTS

| | | |
|---|---|---|
| EP | 2002468 B1 | 7/2013 |
| JP | 03218679 A | 9/1991 |
| JP | 05160408 A | 6/1993 |
| JP | 05198817 A | 8/1993 |
| JP | 06053513 A | 2/1994 |
| JP | 07302914 A | 11/1995 |
| JP | 08032062 A | 2/1996 |
| JP | 10229175 A | 5/1998 |
| JP | 2003124476 A | 4/2003 |
| JP | 2004356314 A | 12/2004 |
| JP | 2004538642 A | 12/2004 |
| JP | 2005039290 A | 2/2005 |
| JP | 2005116969 A | 4/2005 |
| JP | 2005197704 A | 7/2005 |
| JP | 2006511962 A | 4/2006 |
| KR | 102000001758 A | 3/2000 |
| SG | 146344 | 5/2011 |
| TW | I344181 | 6/2011 |
| TW | I349970 B | 10/2011 |
| TW | I357112 | 1/2012 |
| WO | WO-03015171 A1 | 2/2003 |
| WO | WO-2004061972 A1 | 7/2004 |
| WO | WO-2005/079182 A2 | 9/2005 |
| WO | WO-2005079182 A2 | 9/2005 |
| WO | WO-2005079182 A3 | 9/2005 |
| WO | WO-2007114927 A1 | 10/2007 |
| WO | WO-2007120492 A1 | 10/2007 |
| WO | WO-2007120493 A1 | 10/2007 |
| WO | WO-2007136461 A2 | 11/2007 |
| WO | WO-2007136461 A3 | 11/2007 |

OTHER PUBLICATIONS

Bryllert, Tomas, et al., "Vertical high mobility wrap-gated InAs nanowire transistor", *IEEE Device Research Conference*, Santa Barbara, CA, (Jun. 2005),157-158.

Cho, Hyun-Jin, et al., "A Novel Pillar DRAM Cell for 4Gbit and Beyond", *1998 Symposium on VLSI Technology Digest of Technical Papers*, Jun. 9-11, 1998,(Jun. 1998),38-39.

Denton, Jack P., et al., "Fully depleted dual-gated thin-film SOI P-MOSFETs fabricated in SOI islands with an isolated buried polysilicon backgate", *IEEE Electron Device Letters*, 17(11), (Nov. 1996),509-511.

Doyle, B. S., et al., "High performance fully-depleted tri-gate CMOS transistors", *IEEE Electron Device Letters*, vol. 24, No. 4, (Apr. 2003),263-265.

Doyle, B. S., et al., "Tri-Gate fully-depleted CMIS transistors: fabrication, design and layou", *2003 Symposium on VLSI Technology Digest of Technical Papers*, Kyoto, Japan, Jun. 10-12, 2003,(2003),133-134.

Forbes, Leonard, "DRAM Arrays, Vertical Transistor Structures, and Methods of Forming Transistor Structures and DRAM Arrays", U.S. Appl. No. 11/051,119, filed Feb. 3, 2005 (Client Ref. No. 04-0915), 52 pgs.

Forbes Leonard "DRAM Tunneling Access Transistor", U.S. Appl. No. 11/219,085, filed Aug. 29, 2005 (Client Ref. No. 05-0676), 31 pgs.

Forbes, Leonard, "Memory Array with Surrounding Gate Access Transistors and Capacitors with Global and Staggered Local Bit Lines", U.S. Appl. No. 11/128,585, filed May 13, 2005 (Client Ref. No. 04-1029), 42 pgs.

Forbes, Leonard, "Memory Array With Ultra-Thin Etched Pillar Surround Gate Access Transistors and Buried Data/Bit Lines", U.S. Appl. No. 11/129,502, filed May 13, 2005 (Client Ref. No. 04-1007), 33 pgs.

(56) References Cited

OTHER PUBLICATIONS

Samuelson, L., et al., "Semiconductor nanowires for 0D and 1D physics and applications", *Physica E 25*, (Jul. 27, 2004),313-318.
Shimomura, K., et al., "A 1-V 46-ns 16-Mb SOI-DRAM with body control technique", *IEEE Journal of Solid-State Circuits*, 32 (11) (Nov. 1997),1712-1720.
Shimomura, K., et al., "A 1V 46ns 16Mb SOI-DRAM with Body Control Technique", *1997 IEEE International Solid-State Circuits Conference, Digest of Technical Papers*, (Feb. 6, 1997),68-69.
Takato, H., et al., "High Performance CMOS Surrounding Gate Transistor (SGT) for Ultra High Technical Density LSIs", *IEEE International Electron Devices Meeting, Technical Digest*, (1988),222-225.
Wong, Hon-Sum P., et al., "Self-Aligned (Top and Bottom) Double-Gate MOSFET with a 25 nm Thick Silicon Channel", *IEEE Int. Electron Device Meeting*, (1997),427-430.
Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000),67-68.
Ziegler, James F., et al., "Cosmic Ray Soft Error Rates of 16-Mb DRAM Memory Chips", *IEEE Journal of Solid-State Circuits*, vol. 33, No. 2, (Feb. 1998),246-252.
Forbes, Leonard, "Surround Gate Access Transistors With Grown Ultra-Thin Bodies", U.S. Appl. No. 11/175,677, filed Jul. 6, 2005 Client Ref. No. 04-0962), 28 pgs.
Forbes, Leonard, "Ultra-Thin Body Vertical Tunneling Transistor", U.S. Appl. No. 11/215,468, filed Aug. 29, 2005 (Client Ref. No. 05-0664), 27 pgs.
Forbes, Leonard, "Vertical Transistor, Memory Cell, Device, System and Method of Forming Same", U.S. Appl. No. 11/151,219, filed Jun. 13, 2005 (Client Ref. No. 04-0853), 39 pgs.
Forbes, Leonard, "Vertical Tunneling Nano-Wire Transistor", U.S. Appl. No. 11/210,374, filed Aug. 24, 2005 (Client Ref. No. 05-0654), 26 pgs.
Huang, Xuejue, et al., "Sub-50 nm P-Channel finFET", *IEEE Transactions on Electron Devices*, vol. 48, No. 5, (May 2001),880-886.
Kalavade, Pranav, et al., "A novel sub-10 nm transistor", *58th DRC. Device Research Conference. Conference Digest*, (Jun. 19-21, 2000),71-72.
Kedzierski, Jakub, et al., "Threshold voltage control in NiSi-gated MOSFETs through silicidation induced impurity segregation (SIIS)", *IEDM Tech. Dig.*, (2003),315-318.
Kim, Keunwoo, et al., "Nanoscale CMOS Circuit Leakage Power Reduction by Double-Gate Device", *International Symposium on Low Power Electronics and Design*, Newport, CA, Aug. 9-11, 2004; http://www.islped.org,(2004),102-107.
Lee, Choonsup, et al., "A Nanochannel Fabrication Technique without Nanolithography", *Nano Letters*, vol. 3, No. 10, (2003),1339-1340.
Miyano, Shinji, et al., "Numerical Analysis of a Cylindrical Thin-Pillar Transistor (CYNTHIA)", *IEEE Transactions on Electron Devices*, vol. 39, No. 8, (Aug. 1992), 1876-1881.
Nirschl, TH., et al., "The Tunneling Field Effect Transistor (TFET) as an Add-on for Ultra-Low-Voltage Analog and Digital Processes", *IEEE International Electron Devices Meeting, 2004; IEDM Technical Digest*, (Dec. 13-15, 2004), 195-198.
Rahman, Anisur, et al., "Theory of Ballistic Nanotransistor", *IEEE Transactions on Electron Devices*, vol. 50, No. 9, (Sep. 2003),1853-1864.
Samuelson, Lars, "Semiconductor Nanowires as a Novel Electronic Materials Technology for Future Electronic Devices", *IEEE Device Research Conference*, Santa Barbara, CA,(Jun. 2005),245.
"International Application No. PCT/US2007/008084 Search Report dated Jul. 11, 2007",4 pgs.
"International Application No. PCT/US2007/008084 Written Opinion dated Jul. 11, 2007",5 pgs.
Chinese Application Serial No. 200780011084.7, Office Action mailed Aug. 14, 2009, 8 pgs.
Mitsutoshi, et al., "Excimer laser annealing of amorphous and solid-phase-crystallized silicon films.", *Journal of Applied Physics*, vol. 86, No. 10, (Nov. 15, 1999).

"U.S. Appl. No. 11/397,358, Final Office Action mailed Nov. 10, 2010", 11 pgs.
"U.S. Appl. No. 11/397,358, Non-Final Office Action mailed May 24, 2010", 14 pgs.
"U.S. Appl. No. 11/397,358, Response filed Aug. 24, 2010 to Non Final Office Action mailed Jun. 24, 2010", 13 pgs.
"U.S. Appl. No. 11/397,413, Response filed May 12, 2008 to Non Final Office Action mailed Feb. 11, 2008", 11 pgs.
"U.S. Appl. No. 12/192,618, Notice of Allowance mailed Jun. 24, 2010", 9 pgs.
"U.S. Appl. No. 12/192,618, Response filed May 10, 2010 to Final Office Action mailed Mar. 8, 2010", 13 pgs.
"U.S. Appl. No. 12/353,592, Final Office Action mailed Oct. 18, 2010", 14 pgs.
"U.S. Appl. No. 12/353,592, Non-Final Office Action mailed Apr. 29, 2010", 14 pgs.
"U.S. Appl. No. 12/353,592, Response filed Jul. 27, 2010 to Non Final Office Action mailed Apr. 29, 2010", 10 pgs.
"Chinese Application Serial No. 200780011084.7, Office Action mailed Sep. 26, 2010", 3 Pgs.
"Chinese Application Serial No. 200780011164.2, Office Action mailed Mar. 10, 2010", 8 pgs.
"European Application Serial No. 07754850.1, Office Action Mailed May 25, 2010", 6 pgs.
"Taiwan Application Serial No. 96112122, Office Action mailed Sep. 17, 2010", 53 pgs.
"China Application No. 200780012174.8 Office Action mailed on Mar. 1, 2010".
"China Application No. 200780011164.2, Office Action mailed on Oct. 23, 2009".
"http://web.archive.org/web/20020211230307/http://britneyspears.aclphysics/fabrication/photolithography.htm", (Feb. 11, 2002).
"Chinese Application No. 200780011084.7, Amendment filed Jan. 16, 2011", (with English translation of amended claims), 13 pgs.
"Chinese Application Serial No. 200780011164.2, Amendment filed Jan. 17, 2010", (with English translation of amended claims), 16 pgs.
"Chinese Application Serial No. 200780012174.8, Office Action response filed Jan. 28, 2011", (with English translation of amended claims), 12 pgs.
"Chinese Application Serial No. 200780012174.8, Response filed Feb. 10, 2011", (with English translation of amended claims), 13 pgs.
"European Application Serial No. 07754621.6, Examination Notification Art. 94(3) mailed Feb. 4, 2011", 5 Pgs.
"European Application Serial No. 07809002.4, Examination Notification Art. 94(3) mailed Feb. 4, 2011", 5 pgs.
"Japanese Application Serial No. 2009-504232, Amendment filed Mar. 31, 2010", (with English translation of amended claims), 16 pgs.
"Japanese Application Serial No. 2009-504238, Voluntary Amendment filed Mar. 24, 2010", (with English translation of amended claims), 17 pgs.
"Japanese Application Serial No. 2009-504280, Amendment filed Mar. 31, 2010", with English translation, 15 pgs.
"Chinese Application Serial No. 200780012174.8, Office Action mailed Mar. 30, 2011", Notification letter, 4 pgs.
"Taiwan Application Serial No. 096112121, Office Action mailed Apr. 7, 2011", Notification letter, 2 pgs.
"Taiwan Application Serial No. 96112122, Notice of Allowance Mar. 8, 2011", Notification letter, 2 pgs.
"Chinese Application Serial No. 200780012174.8, Office Action mailed Mar. 30, 2011", 4 pgs.
"European Application Serial No. 07754621.6, Response filed May 16, 2011 to Examination Notification Art. 94(3) mailed Feb. 4, 2011", 7 pgs.
"European Application Serial No. 07809002.4, Response filed May 23, 2011 to Examination Notification Art. 94(3) mailed Feb. 4, 2011", 11 pgs.
"Taiwan Application Serial No. 96112122, Notice of Allowance Mar. 8, 2011", 2 pgs.
"European Application Serial No. 07754850.1, Office Action mailed Jun. 9, 2011", 5 pgs.
"Chinese Application Serial No. 200780012174.8, Office Action mailed Dec. 3, 2010", 5 pgs.

(56) References Cited

OTHER PUBLICATIONS

"European Application Serial No. 07754850.1, Office Action Response mailed Nov. 17, 2010", 19 pgs.

"Taiwan Application Serial No. 096112121, Office Action mailed Dec. 24, 2010", 7 pgs.

"Taiwan Application Serial No. 96112122, Office Action Response filed Jan. 6, 2011", 36 pgs.

"Taiwan Application Serial No. 96112125, Office Action mailed Dec. 2, 2010", 15 pgs.

"Chinese Application Serial No. 200780011084.7, Office Action mailed Sep. 15, 2011", 10 pgs.

"Chinese Application Serial No. 200780011084.7, Response filed Nov. 30, 2011 to Office Action mailed Sep. 15, 2011", 8 pgs.

"Japanese Application Serial No. 2009-504232, Office Action mailed Oct. 9, 2012", With English Translation, 14 pgs.

"Korean Application Serial No. 10-2008-7027077, Voluntary Amendment filed Apr. 2, 2012", 14 pgs.

"Taiwan Application Serial No. 96112124, Notice of Allowance mailed Jul. 13, 2011", 2.

European Application Serial No. 07809002.4, Office Action mailed Feb. 20, 2013, 7 pgs.

European Application Serial No. 07809002.4, Response filed Jul. 1, 2013 to Examination Notification Art. 94(3) mailed Feb. 20, 2013, 14 pgs.

Japanese Application Serial No. 2009-504232, Response filed Jan. 9, 2031 to Office Action mailed Oct. 19, 2012, 16 pgs.

Korean Application Serial No. 10-2008-7026973, Preliminary Rejection mailed Jun. 25, 2013, 7 pgs.

Korean Application Serial No. 10-2008-7026973, Response filed Aug. 26, 2013 to Office Action mailed Jun. 25, 2013, 29 pgs.

Korean Application Serial No. 10-2008-7027075, Response filed Jul. 31, 2013 to Office Action mailed May 16, 2013, 20 pgs.

Korean Application Serial No. 10-2008-7027077, Notice of Preliminary Rejection mailed Jun. 7, 2013, 12 pgs.

Korean Application Serial No. 10-2008-7027077, Response filed Aug. 7, 2013 to Office Action mailed Jun. 7, 2013, 17 pgs.

\* cited by examiner $V_G \longrightarrow V_G/k$     $V_0 \longrightarrow V_0/k$ $t_{OX} \longrightarrow t_{OX}/k$ $L \longrightarrow L/k$ $X_j \longrightarrow X_j/k$     JUNCTION DEPTH DECREASED $W_d \longrightarrow W_d/k$ $N_A \longrightarrow k\,N_A$     SUBSTRATE DOPING INCREASED

US 8,734,583 B2

GROWN NANOFIN TRANSISTORS

CROSS REFERENCE TO RELATED APPLICATIONS

This application is related to the following commonly assigned U.S. patent applications which are filed on even date herewith and are herein incorporated by reference in their entirety: "Nanowire Transistor With Surrounding Gate," U.S. application Ser. No. 11/397,527, filed on Apr. 4, 2006; "Etched Nanofin Transistors," U.S. application Ser. No. 11/397,358, filed on Apr. 4, 2006; "DRAM With Nanofin Transistors," U.S. application Ser. No. 11/397,413, filed on Apr. 4, 2006; and "Tunneling Transistor With Sublithographic Channel," U.S. application Ser. No. 11/397,406, filed on Apr. 4, 2006.

TECHNICAL FIELD

This disclosure relates generally to semiconductor devices, and more particularly, to nanofin transistors.

BACKGROUND

The semiconductor industry has a market driven need to reduce the size of devices, such as transistors, and increase the device density on a substrate. Some product goals include lower power consumption, higher performance, and smaller sizes. FIG. 1 illustrates general trends and relationships for a variety of device parameters with scaling by a factor k. The continuous scaling of MOSFET technology to the deep sub-micron region where channel lengths are less than 0.1 micron (100 nm or 1000 Å) causes significant problems in the conventional transistor structures. For example, junction depths should be much less than the channel length. Thus, with reference to the transistor 100 illustrated in FIG. 1, the junctions depths 101 should be on the order of a few hundred Angstroms for channels lengths 102 that are approximately 1000 Å long. Such shallow junctions are difficult to form by conventional implantation and diffusion techniques. Extremely high levels of channel doping are required to suppress short-channel effects such as drain induced barrier lowering, threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus, the expected improved performance attributed to a shorter channel is negated by the lower carrier mobility and higher leakage attributed to the higher doping.

Leakage current is a significant issue in low voltage and lower power battery-operated CMOS circuits and systems, and particularly in DRAM circuits. The threshold voltage magnitudes are small to achieve significant overdrive and reasonable switching speeds. However, as illustrated in FIG. 2, the small threshold results in a relatively large sub-threshold leakage current.

Some proposed designs to address this problem use transistors with ultra-thin bodies, or transistors where the surface space charge region scales as other transistor dimensions scale down. Dual-gated or double-gated transistor structures also have been proposed to scale down transistors. As commonly used in the industry, "dual-gate" refers to a transistor with a front gate and a back gate which can be driven with separate and independent voltages, and "double-gated" refers to structures where both gates are driven when the same potential. An example of a double-gated device structure is the FinFET. "TriGate" structures and surrounding gate structures have also been proposed. In the "TriGate" structure, the gate is on three sides of the channel. In the surrounding gate structure, the gate surrounds or encircles the transistor channel. The surrounding gate structure provides desirable control over the transistor channel, but the structure has been difficult to realize in practice.

FIG. 3 illustrates a dual-gated MOSFET with a drain, a source, and front and back gates separated from a semiconductor body by gate insulators, and also illustrates an electric field generated by the drain. Some characteristics of the dual-gated and/or double-gated MOSFET are better than the conventional bulk silicon MOSFETs, because compared to a single gate, the two gates better screen the electric field generated by the drain electrode from the source-end of the channel. The surrounding gate further screens the electric field generated by the drain electrode from the source. Thus, sub-threshold leakage current characteristics are improved, because the sub-threshold current is reduced more quickly as the gate voltage is reduced when the dual-gate and/or double gate MOSFET turns off. FIG. 4 generally illustrates the improved sub-threshold characteristics of dual gate, double-gate, or surrounding gates MOSFETs in comparison to the sub-threshold characteristics of conventional bulk silicon MOSFETs.

FIGS. 5A-C illustrate a conventional FinFET. FIG. 5A illustrates a top view of the FinFET and FIG. 5B illustrates an end view of the FinFET along line 5B-5B. The illustrated FinFET 503 includes a first source/drain region 504, a second source drain region 505, and a silicon fin 506 extending between the first and second source/drain regions. The silicon fin functions as a transistor body, where the channel between the first and second source/drain regions is horizontal. A gate insulator 507, such as silicon oxide, is formed over the fin, and a gate 508 is formed over the fin after the oxide is formed thereon. The fin of the illustrated conventional FinFET is formed over buried oxide 509. FIG. 5C illustrates a conventional etch technique for fabricating the fin for the FINFET. As illustrated in FIG. 5C, the fin width is defined by photolithography or e-beam lithography and etch. Thus, the fin width is initially a minimum feature size (1F). The width of the fin is subsequently reduced by oxidation or etch, as illustrated by arrows 510.

SUMMARY

Aspects of the present subject matter grow ultrathin fins of semiconductor (e.g. silicon) from amorphous semiconductor (e.g. a-silicon) using solid phase epitaxy (SPE) on a crystalline substrate. The SPE process recrystallizes the amorphous semiconductor, using the crystalline substrate to seed the crystalline growth. The amorphous nanofins are formed with dimensions smaller than lithographic dimensions by a side-wall spacer technique. The nanofins are used as the body regions of CMOS transistors where both the thickness of the body of the transistor and channel length have dimensions smaller than lithographic dimensions. For example, some embodiments provide ultrathin nanofins with a thickness on the order of 20 nm to 50 nm.

One aspect of the present subject matter relates to a method for forming a transistor. According to an embodiment, a fin of amorphous semiconductor material is formed on a crystalline substrate, and a solid phase epitaxy (SPE) process is performed to crystallize the amorphous semiconductor material using the crystalline substrate to seed the crystalline growth. The fin has a cross-sectional thickness in at least one direction less than a minimum feature size. The transistor body is formed in the crystallized semiconductor pillar between a first source/drain region and a second source/drain region. A surrounding gate insulator is formed around the semiconductor pillar, and a surrounding gate is formed around and separated from the semiconductor pillar by the surrounding gate insulator.

In an embodiment for forming a transistor, a silicon nitride layer is formed on a silicon wafer, and a hole is etched in the silicon nitride. The hole extends through the silicon nitride layer to the silicon wafer and is defined by the sides of the silicon nitride layer. Amorphous silicon oxide sidewall spacers are formed on the sides of the silicon nitride that define the hole. The silicon nitride layer is removed, leaving the amorphous silicon oxide sidewall spacers on the silicon wafer. The sidewall spacers are crystallized. The sidewall spacers are masked and etched to form at least one silicon fin from the sidewall spacers. The silicon fin is positioned over a doped region to function as a first source/drain region for the transistor. A surrounding gate insulator is formed around the silicon fin, and a surrounding gate is formed around and separated from the silicon fin by the surrounding gate insulator. A second source/drain region is formed in a top portion of the silicon fin.

An aspect relates to a transistor. A transistor embodiment includes a crystalline substrate, a crystalline semiconductor fin on the substrate, a gate insulator formed around the fin, and a surrounding gate formed around and separated form the fin by the gate insulator. The fin has a cross-sectional dimension that is less than a minimum feature size. The fin provides a vertically-oriented channel between a lower source/drain region and an upper source/drain region.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Disclosed herein are nanofin transistors, and a fabrication technique in which vertical amorphous silicon nanofins are recrystallized on a substrate to make single crystalline silicon nanofin transistors. Aspects of the present subject matter provide nanofin transistors with vertical channels, where there is a first source/drain region at the bottom of the fin and a second source/drain region at the top of the fin. FIGS. 6A-6L illustrate a process for forming a nanofin transistor, according to various embodiments of the present subject matter.

Figure 1:
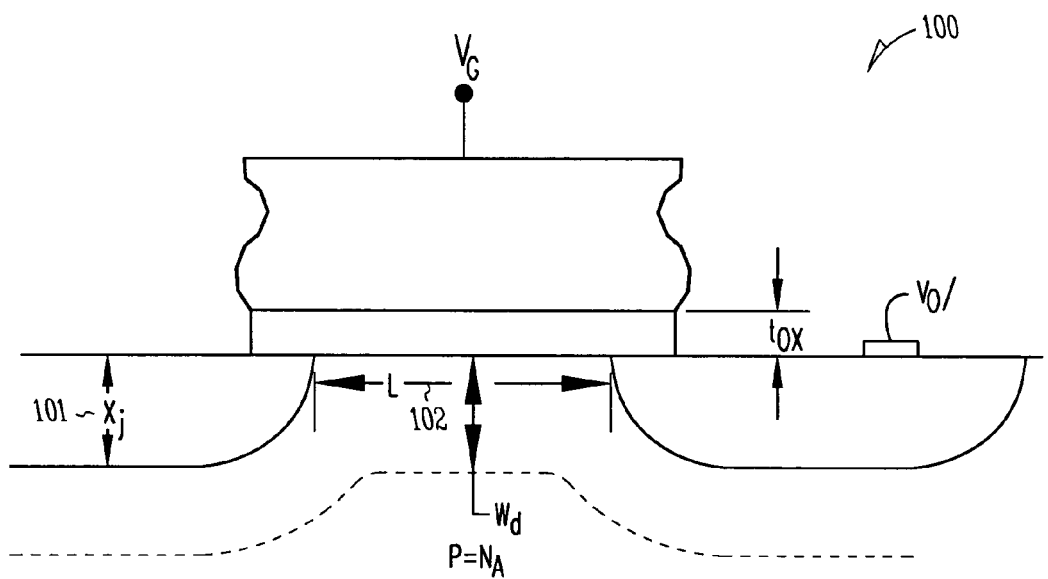
FIG. 1 illustrates general trends and relationships for a variety of device parameters with scaling by a factor k.
Figure 2:
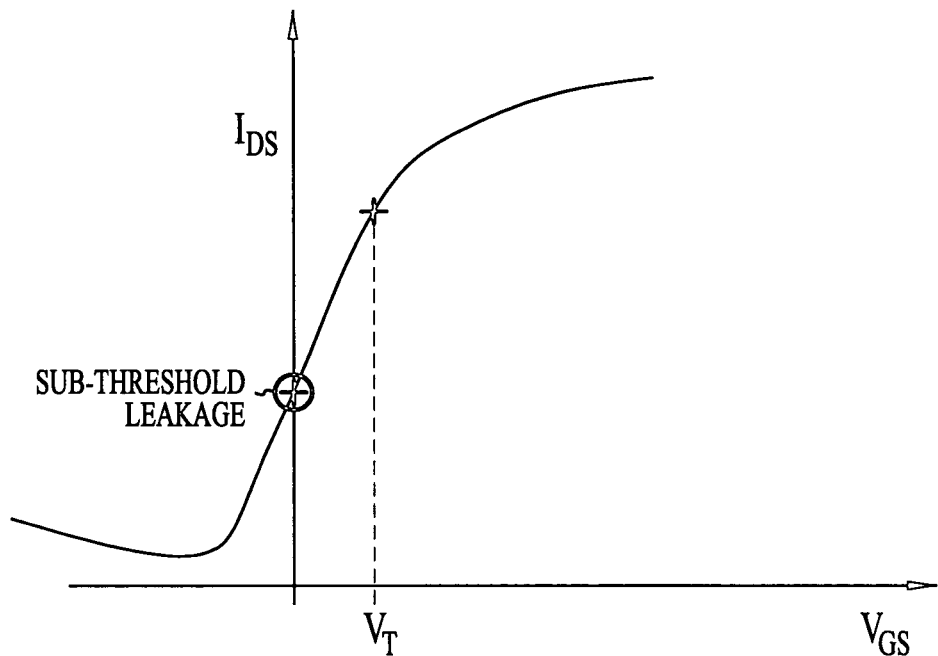
FIG. 2 illustrates sub-threshold leakage in a conventional silicon MOSFET.
Figure 3:
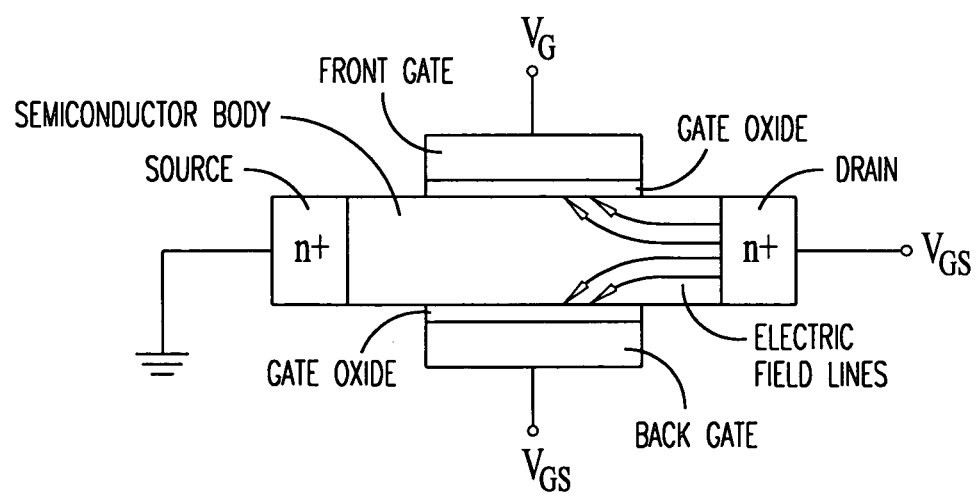
FIG. 3 illustrates a dual-gated MOSFET with a drain, a source, front and back gates separated from a semiconductor body by gate insulators, and an electric field generated by the drain.
Figure 4:
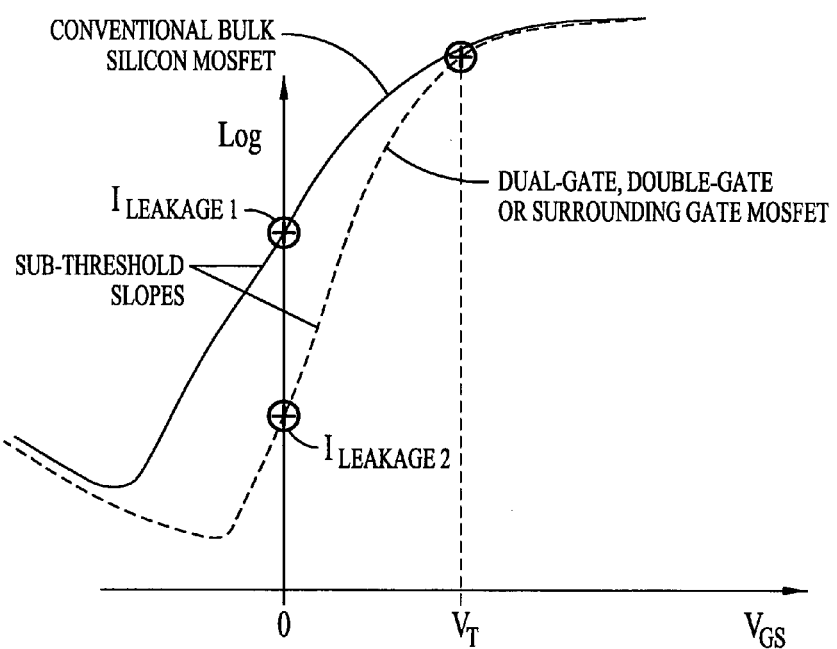
FIG. 4 generally illustrates the improved sub-threshold characteristics of dual gate, double-gate, and surrounding gate MOSFETs in comparison to the sub-threshold characteristics of conventional bulk silicon MOSFETs.
Figure 5A:
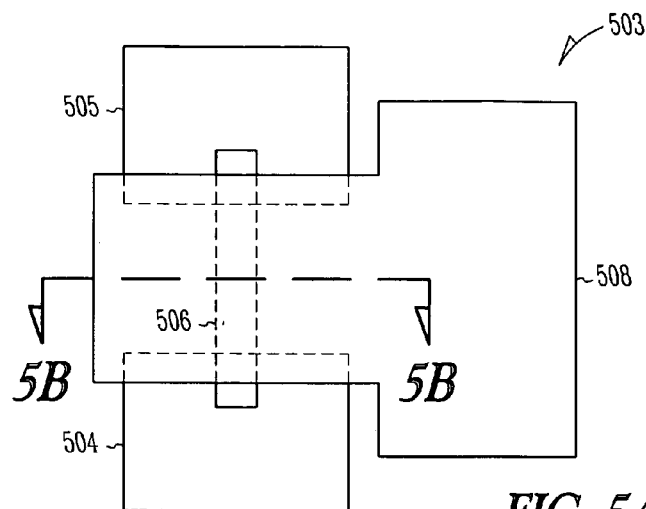
FIGS. 5A-C illustrate a conventional FinFET.
Figure 5B:
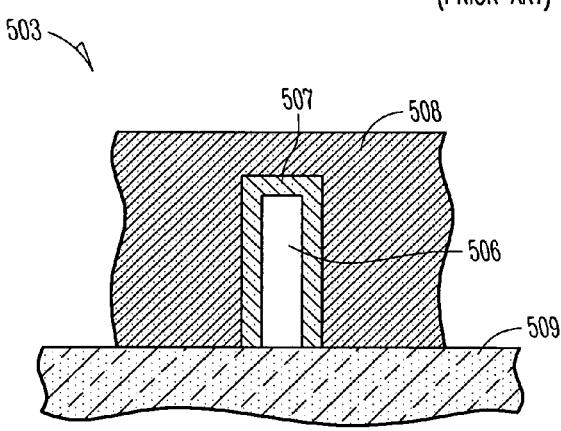
Figure 5C:
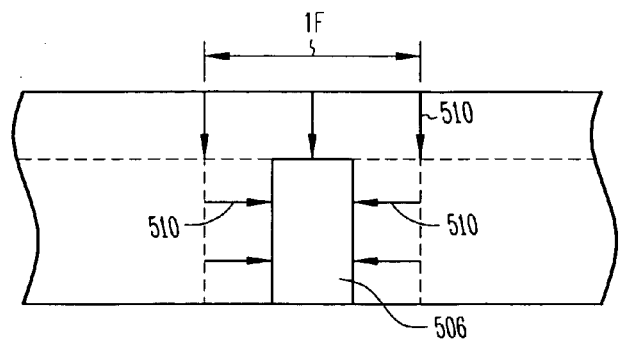
Figure 6A:
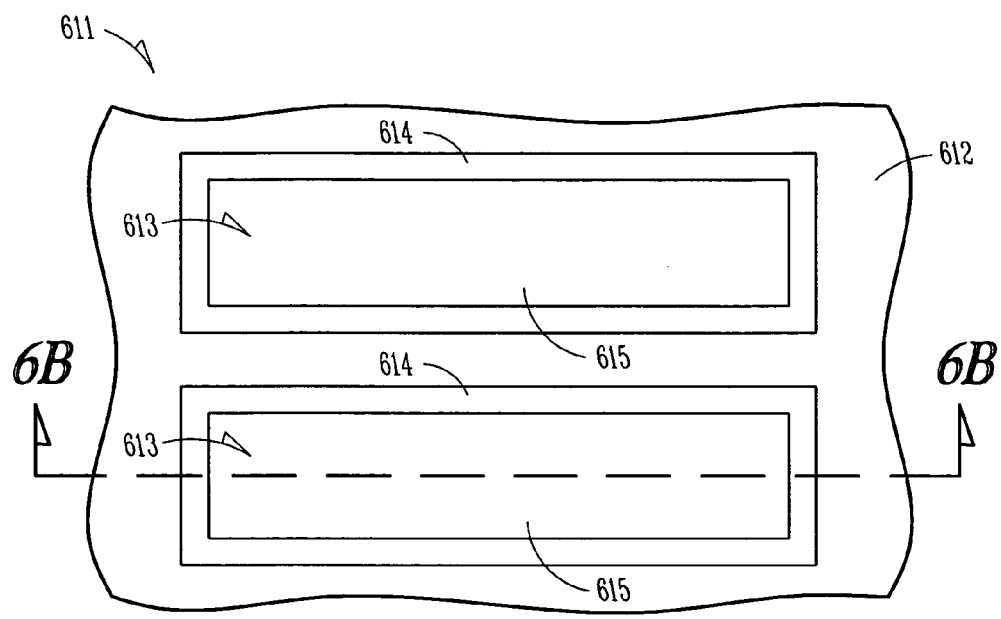
FIGS. 6A-6L illustrate a process for forming a nanofin transistor, according to various embodiments of the present subject matter.
Figure 6B:
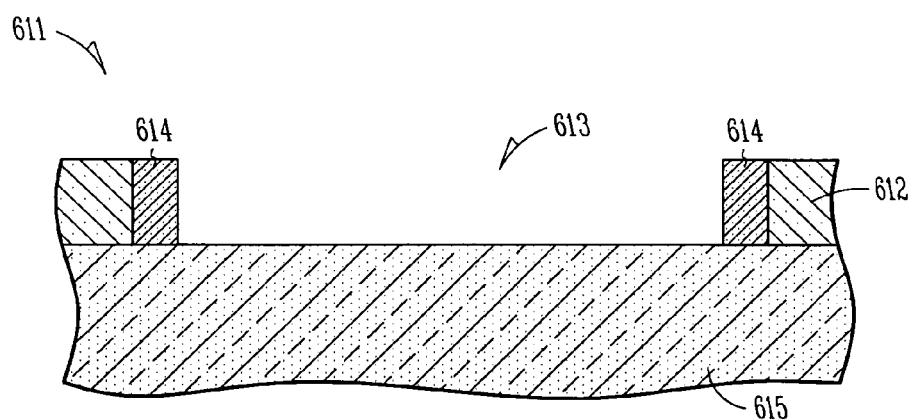

FIGS. 6A and 6B illustrate a top view and a cross-section view along 6B-6B, respectively, of a semiconductor structure 611 with a silicon nitride layer 612, holes 613 in the silicon nitride layer, and sidewall spacers 614 of amorphous silicon along the walls of the holes. The holes are etched in the silicon nitride layer, and amorphous silicon deposited and directionally etched to leave only on the sidewalls. The holes 613 are etched through the silicon nitride layer 612 to a silicon wafer or substrate 615.

Figure 6C:
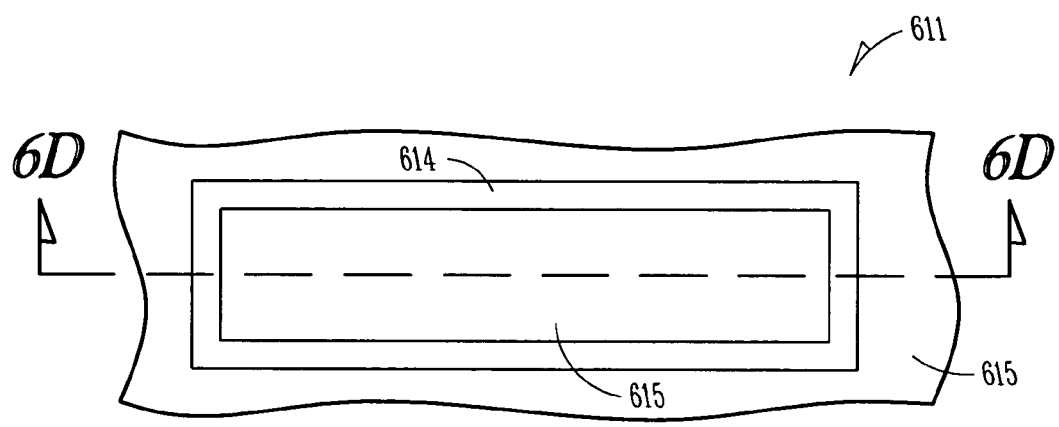
Figure 6D:
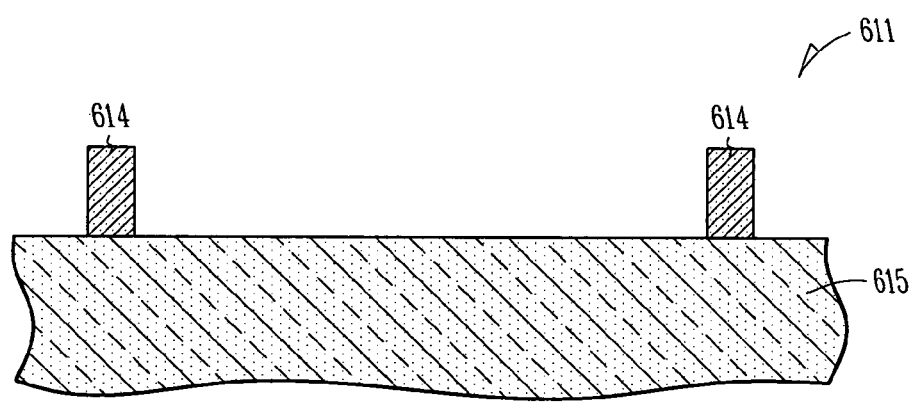

FIGS. 6C and 6D illustrate a top view and a cross-section view along line 6D-6D, respectively, of the structure after the silicon nitride layer is removed. As illustrated, after the silicon nitride layer is removed, the sidewalls 614 are left as standing narrow regions of amorphous silicon. The resulting patterns of standing silicon can be referred to as "racetrack" patterns, as they have a generally elongated rectangular shape. The width of the lines is determined by the thickness of the amorphous silicon rather than masking and lithography. For example, the thickness of the amorphous silicon may be on the order of 20 nm to 50 nm, according to various embodiments. A solid phase epitaxial (SPE) growth process is used to recrystallize the standing narrow regions of amorphous silicon. The SPE growth process includes annealing, or heat treating, the structure to cause the amorphous silicon to crystallize, beginning at the interface with the silicon substrate 615 which functions as a seed for crystalline growth up through the remaining portions of the standing narrow regions of silicon.

Figure 6E:
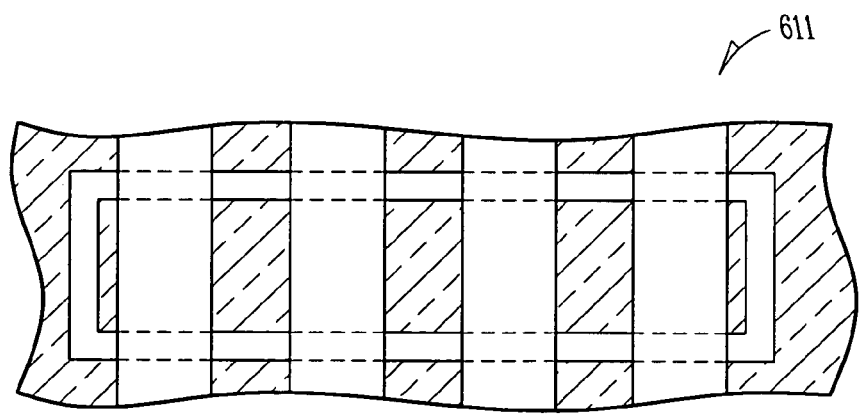
Figure 6F:
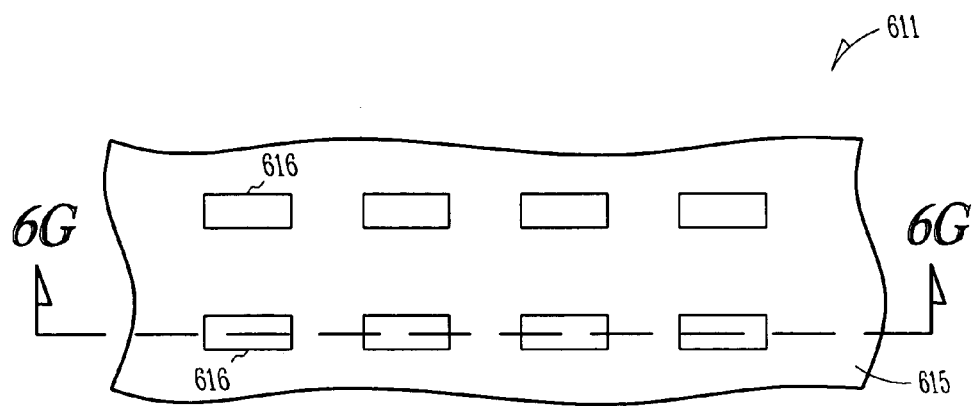
Figure 6G:
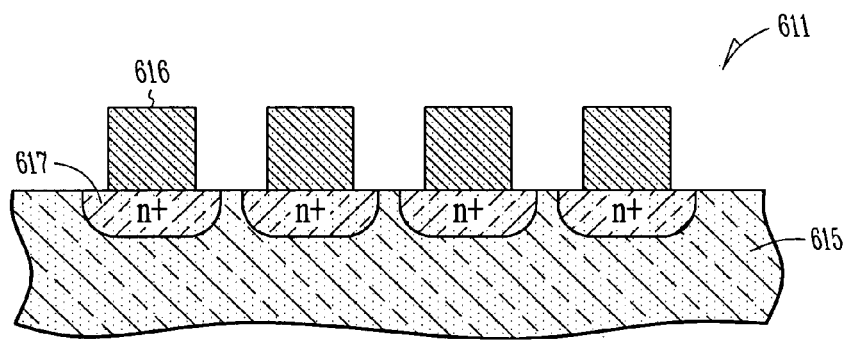

FIG. 6E illustrates a top view of the structure 611, after a mask layer has been applied. The shaded areas are etched, leaving free-standing fins formed of crystalline silicon. FIGS. 6F and 6G illustrate a top view and a cross-section view along line 6G-6G, respectively, of the pattern of free-standing fins 616. A buried doped region 617 functions as a first source/drain region. According to various embodiments, the buried doped region can be patterned to form a conductive line either the row or column direction of the array of fins.

Figure 6H:
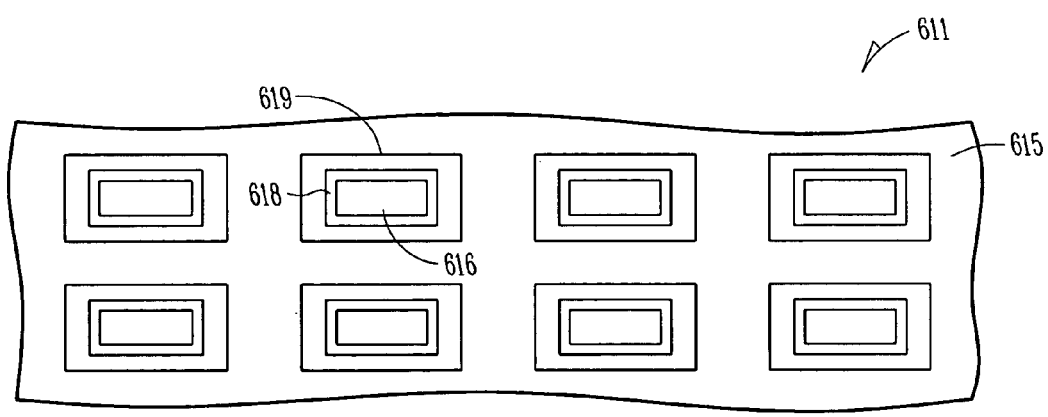

FIG. 6H illustrates a top view of the structure, where the fins have been surrounded by a gate insulator 618 and a gate 619. The gate insulator can be deposited or otherwise formed in various ways. For example, a silicon oxide can be formed on the silicon fin by a thermal oxidation process. The gate can be any gate material, such as polysilicon or metal. The gate material is deposited and directionally etched to leave the gate material only on the sidewalls of the fin structure with the gate insulator. The wiring can be oriented in either the "x-direction" or "y-direction."

Figure 6I:
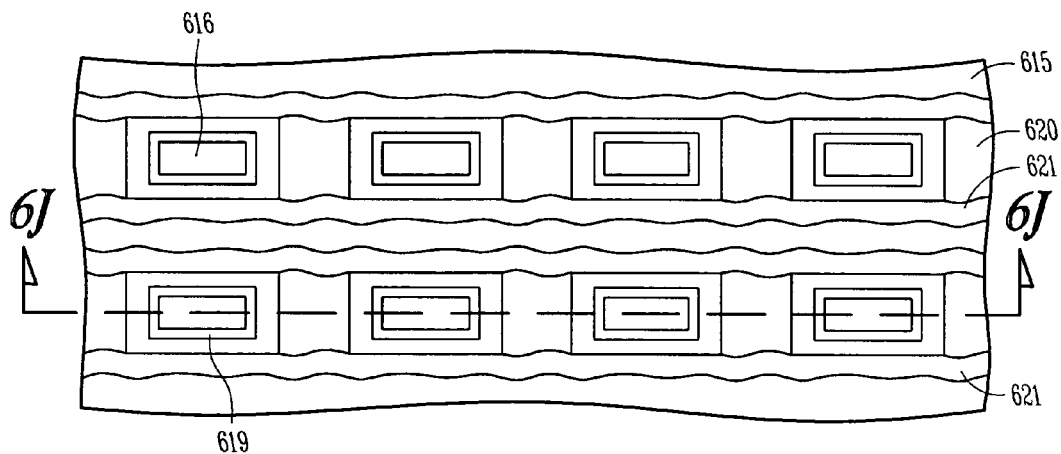
Figure 6J:
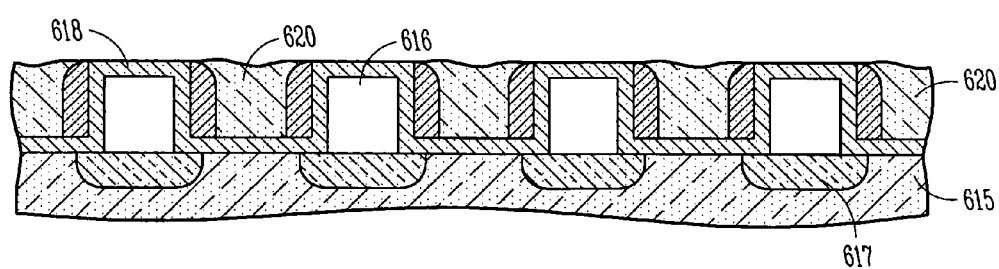

FIGS. 6I and 6J illustrate a top view and a cross-section view along line 6J-6J, respectively, of the structure illustrated in FIG. 6H after the structure is backfilled with an insulator 620 and gate wiring 621 is formed in an "x-direction" along the long sides of the fins. Various embodiments backfill the structure with silicon oxide. Trenches are formed in the backfilled insulator to pass along a side of the fins, and gate lines are formed in the trenches. In various embodiments, one gate line passes along one side of the fins, in contact with the surrounding gate of the fin structure. Some embodiments provide a first gate line on a first side of the fin and a second gate line on a second side of the fin. The gate wiring material, such as polysilicon or metal, can be deposited and directionally etched to leave on the sidewalls only. The gate wiring material appropriately contacts the surrounding gates for the fins. In various embodiments, the gate material and gate wiring material are etched to recess the gate and gate wiring below the tops of the fins. The whole structure can be backfilled with an insulator, such as silicon oxide, and planarized to leave only oxide on the surface. The top of the pillars or fins can be exposed by an etch. A second source/drain region 622 can be implanted in a top portion of the fins, and metal contacts 623 to the drain regions can be made by conventional techniques. The metal wiring can run, for example, in the "x-direction" and the buried source wiring run perpendicular, in the plane of the paper in the illustration.

Figure 6K:
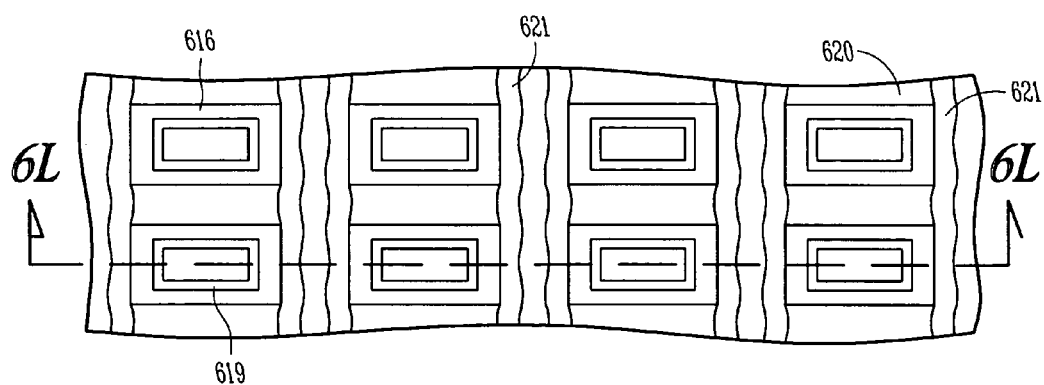
Figure 6L:
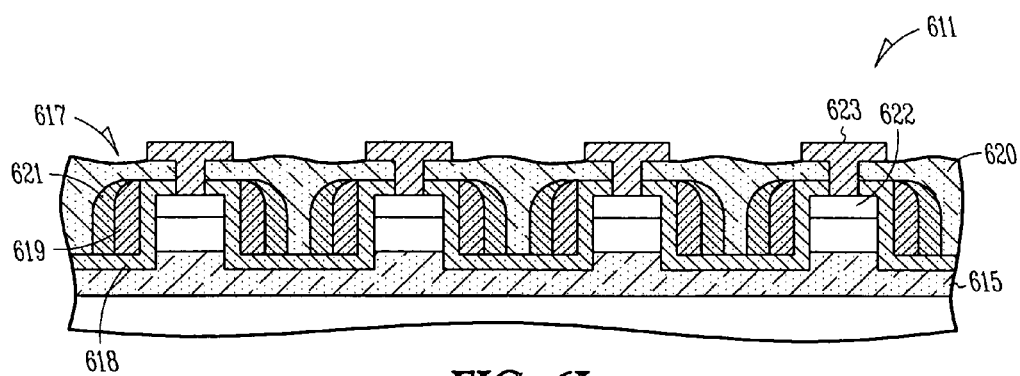

FIGS. 6K and 6L illustrate a top view and a cross-section view along line 6L-6L, respectively, of the structure after the structure is backfilled with an insulator and gate wiring is formed in an "y-direction" along the short sides of the fins. Trenches are opened up along the side of the fins in the "y-direction." Gate wiring material 621, such as polysilicon or metal, can be deposited and directionally etched to leave on the sidewalls only and contacting the gates on the fins. In various embodiments, the gate material and gate wiring material are etched to recess the gate and gate wiring below the tops of the fins. The whole structure can be backfilled with an insulator 620, such as silicon oxide, and planarized to leave only the backfill insulator on the surface. Contact openings and drain doping regions 622 can then be etched to the top of the pillars and drain regions implanted and metal contacts to the drain regions made by conventional techniques. The metal wiring can run, for example, perpendicular to the plane of the paper in the illustration and the buried source wiring runs in the "x-direction." The buried source/drains are patterned and implanted before deposition of the amorphous silicon. FIG. 6L gives an illustration of one of the completed fin structures with drain/source regions, recessed gates, and source/drain region wiring. These nanofin FET's can have a large W/L ratio and are able to conduct more current than nanowire FET's.

Figure 7:
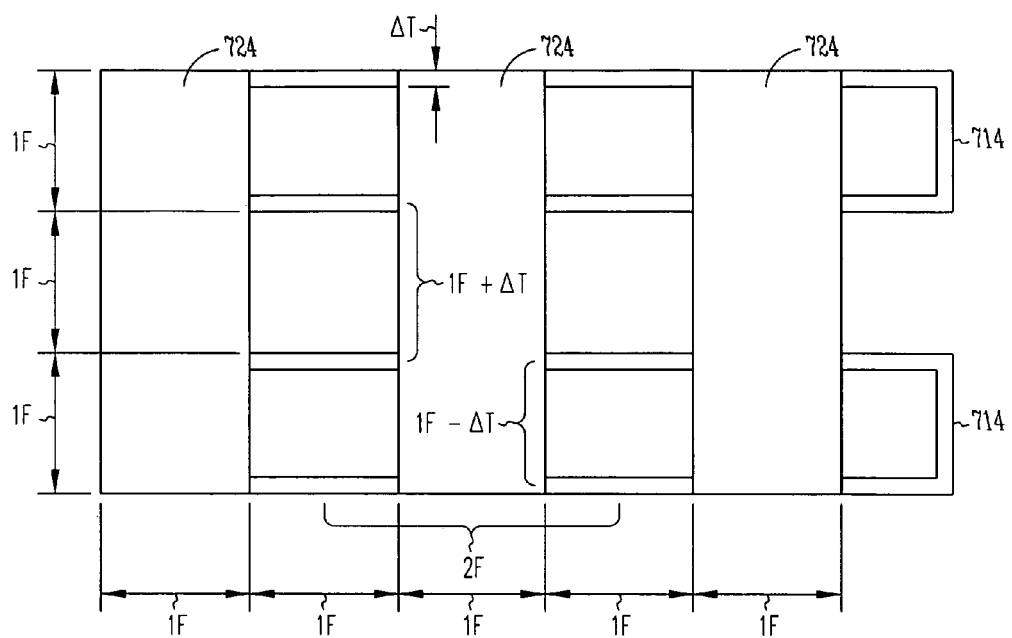
FIG. 7 illustrates a top view of a layout of nanofins for an array of nanofin transistors, according to various embodiments of the present subject matter.

FIG. 7 illustrates a top view of a layout of nanofins for an array of nanofin transistors, according to various embodiments. The figure illustrates two "racetracks" of sidewall spacers 714, and further illustrates the portions of the sidewall spacers removed by an etch. The holes used to form the sidewall spacer tracks were formed with a minimum feature size (1F). The mask strips 724 have a width of a minimum feature size (1F) and are separated by a minimum feature size (1F). In the illustrated layout, the columns of the nanofins have an approximately 2F center-to-center spacing, and the rows of the nanofins have an approximately 1F center-to-center spacing. Also, as illustrated in FIG. 7, since the nanofins are formed from sidewall spacers on the walls of the holes, the center-to-center spacing between first and second rows will be slightly less than 1F by an amount corresponding to the thickness of the nanofins (1F$-\Delta$T), and the center-to-center spacing between second and third rows will be slightly more than 1F size by an amount corresponding to the thickness of the nanofins (1F$+\Delta$T). In general, the center-to-center spacing between first and second rows will be slightly less than a feature size interval (NF) by an amount corresponding to the thickness of the nanofins (NF$-\Delta$T), and the center-to-center spacing between second and third rows will be slightly more than a feature size interval (NF) by an amount corresponding to the thickness of the nanofins (NF$+\Delta$T).

Figure 8:
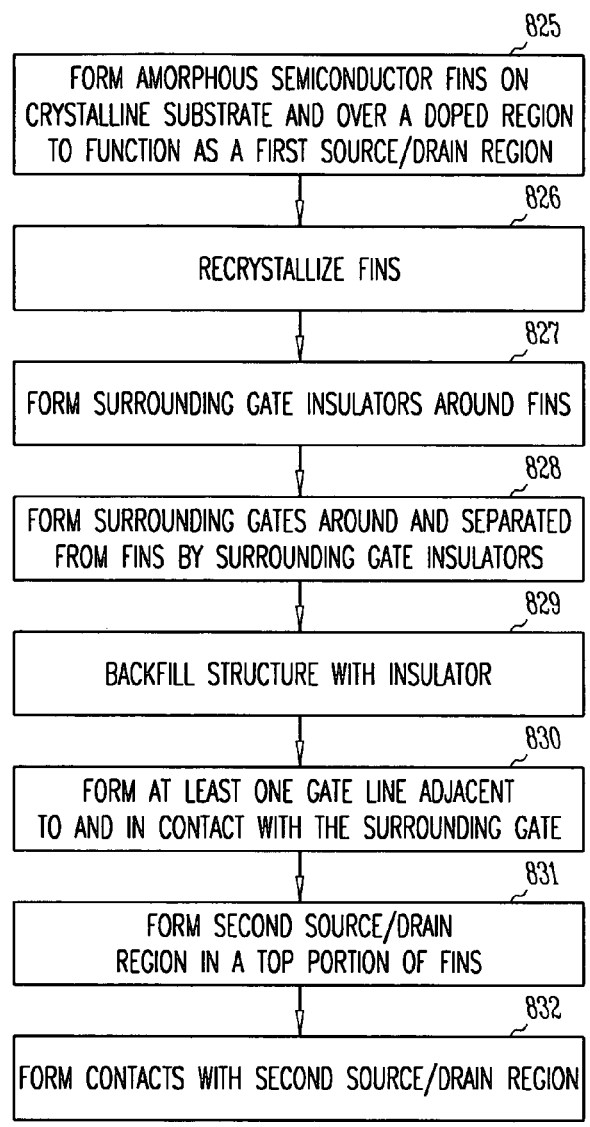
FIG. 8 illustrates a process to fabricate a nanofin transistor, according to various embodiments of the present subject matter.

FIG. 8 illustrates a process to fabricate a nanofin transistor, according to various embodiments of the present subject matter. At 825, amorphous semiconductor fins are formed on a crystalline substrate and over a doped region that is to function as a first source/drain region. In some embodiments, the substrate is doped and diffused after the fins are formed. The fins are thin such that the dopant is able to diffuse under and into a bottom portion of the fin. The fins are crystallized at 826. A solid phase epitaxial (SPE) process is used, in which the structure is annealed and the crystalline substrate seeds crystalline growth in the fins. At 827, surrounding gate insulators are formed around the fins; and at 828, surrounding gates are formed around and separated from the fins by surrounding the gate insulators. The resulting structure is backfilled with an insulator at 829. Trenches are etched and gate line(s) are formed adjacent to and in contact with the surrounding gate, as illustrated at 830. At 831, a second source/drain region is formed in a top portion of the fins, and contacts for the second source/drain regions are formed at 832.

Figure 9:
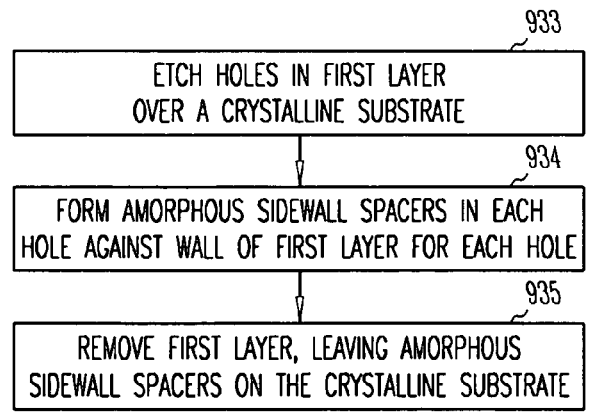
FIG. 9 illustrates a process to form amorphous semiconductor fins, according to various embodiments of the present subject matter.

FIG. 9 illustrates a process to form amorphous semiconductor fins, such as illustrated at 825 in FIG. 8, according to various embodiments of the present subject matter. At 933, holes are etched in a first layer over a crystalline substrate. At 934, amorphous sidewall spacers are formed in each hole against the wall of the first layer for each hole. The first layer is removed at 935, which leaves the amorphous semiconductor fins on the crystalline substrate.

Figure 10:
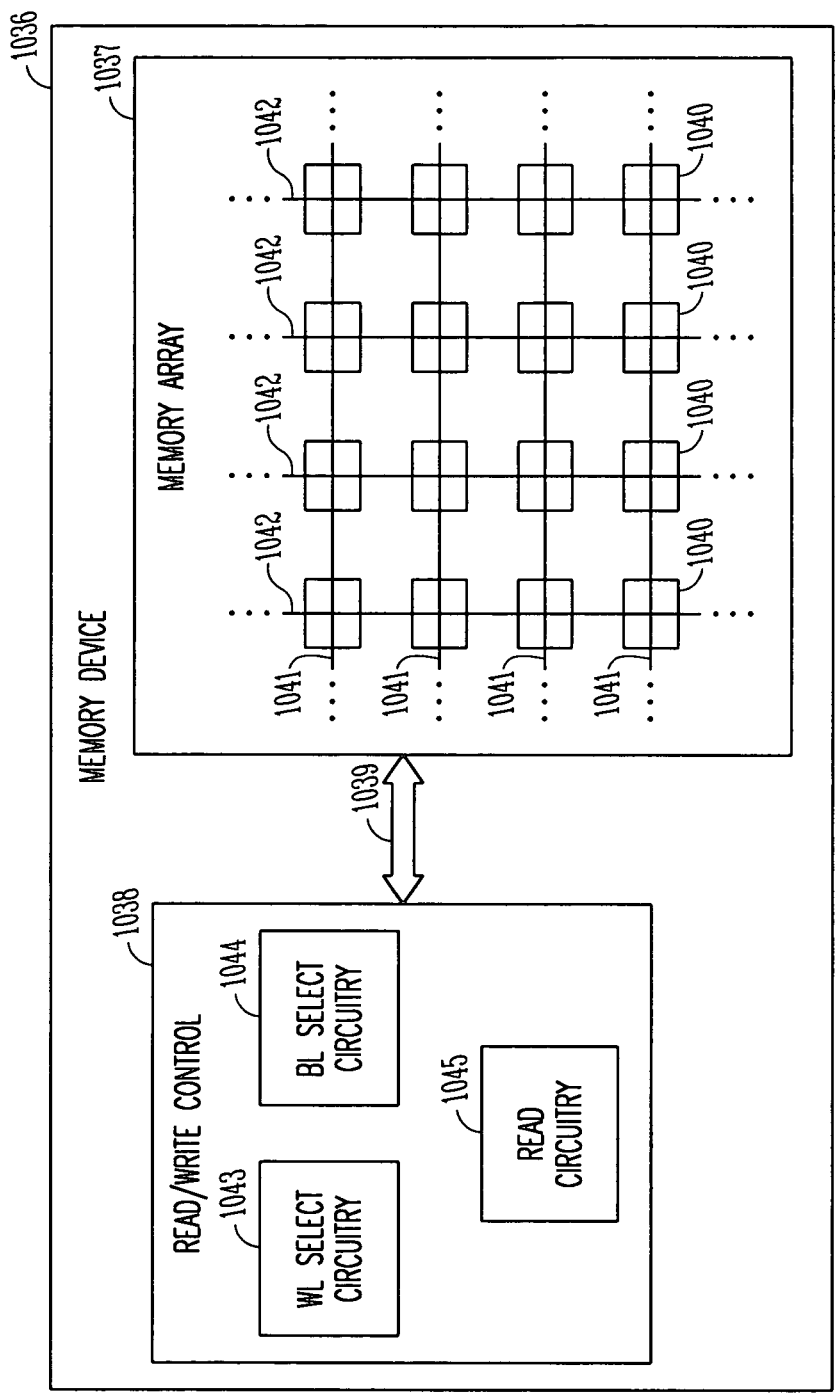
FIG. 10 is a simplified block diagram of a high-level organization of various embodiments of a memory device according to various embodiments of the present subject matter.

FIG. 10 is a simplified block diagram of a high-level organization of various embodiments of a memory device according to various embodiments of the present subject matter. The illustrated memory device 1036 includes a memory array 1037 and read/write control circuitry 1038 to perform operations on the memory array via communication line(s) or channel(s) 1039. The illustrated memory device 1036 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry can include nanofin transistors, as described above. The structure and fabrication methods for these devices have been described above.

The memory array 1037 includes a number of memory cells 1040. The memory cells in the array are arranged in rows and columns. In various embodiments, word lines 1041 connect the memory cells in the rows, and bit lines 1042 connect the memory cells in the columns. The read/write control circuitry 1038 includes word line select circuitry 1043 which functions to select a desired row, bit line select circuitry 1044 which functions to select a desired column, and read circuitry 1045 which functions to detect a memory state for a selected memory cell in the memory array 1037.

Figure 11:
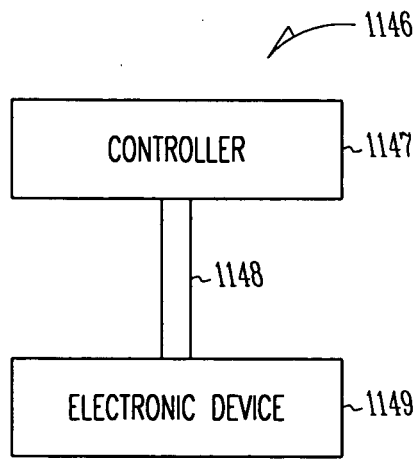
FIG. 11 illustrates a diagram for an electronic system having nanofin transistors.

FIG. 11 illustrates a diagram for an electronic system 1146 having one or more nanofin transistors, according to various embodiments. Electronic system 1146 includes a controller 1147, a bus 1148, and an electronic device 1149, where the bus provides communication channels between the controller and the electronic device. In various embodiments, the controller and/or electronic device include nanofin transistors as previously discussed herein. The illustrated electronic system 1146 may include, but is not limited to, information handling devices, wireless systems, telecommunication systems, fiber optic systems, electro-optic systems, and computers.

Figure 12:
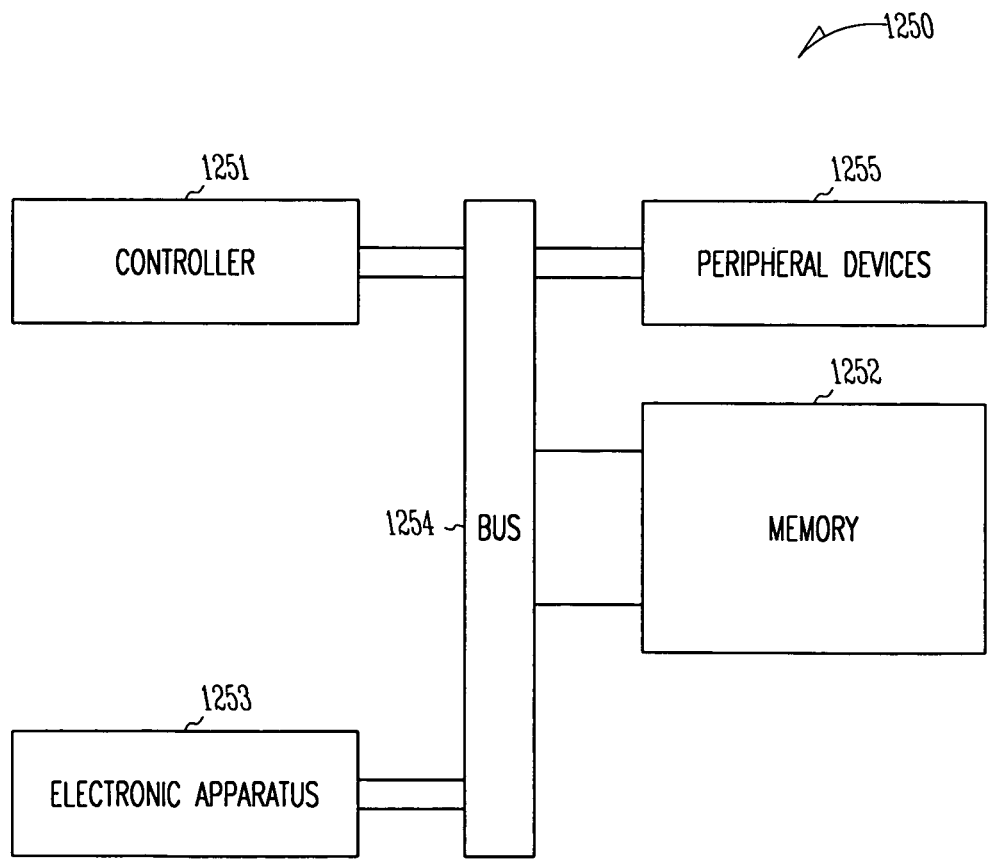
FIG. 12 depicts a diagram of an embodiment of a system having a controller and a memory.

FIG. 12 depicts a diagram of an embodiment of a system 1250 having a controller 1251 and a memory 1252. The controller 1251 and/or memory 1252 may include nanofin transistors according to various embodiments. The illustrated system 1250 also includes an electronic apparatus 1253 and a bus 1254 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1253 may be additional memory configured similar to memory 1252. An embodiment may include a peripheral device or devices 1255 coupled to the bus 1254. Peripheral devices may include displays, additional storage memory, or other control devices that may operate in conjunction with the controller and/or the memory. In an embodiment, the controller is a processor. Any of the controller 1251, the memory 1252, the electronic apparatus 1253, and the peripheral devices 1255 may include nanofin transistors according to various embodiments. The system 1250 may include, but is not limited to, information handling devices, telecommunication systems, and computers. Applications containing nanofin transistors, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The memory may be realized as a memory device containing nanofin transistors according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM). Various emerging memory technologies are capable of using nanofin transistors.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing and understanding the above description. The scope of the present subject matter should be determined with reference to the appended claims, along with the full scope of equivalents to which such claims are entitled.

What is claimed is:

1. A method for forming a transistor, comprising:
    forming a transistor body, including:
        forming a fin of amorphous semiconductor material on a substantially planar surface of a crystalline substrate, the fin formed on the surface having a cross-sectional thickness in at least one direction less than a minimum feature size, wherein the at least one direction is substantially parallel to the surface of the substrate; and
        performing a solid phase epitaxy (SPE) process to crystallize the amorphous semiconductor material using the crystalline substrate to seed the crystalline growth from the substrate in a direction away from the substrate to transform the fin of amorphous semiconductor material into a crystallized fin, the transistor body being formed in the crystallized fin between a first source/drain region and a second source/drain region;
    forming a surrounding gate insulator around the crystallized fin; and
    forming a surrounding gate around and separated from the crystallized fin by the surrounding gate insulator.

2. The method of claim 1, wherein the fin has a cross-sectional thickness in a first direction corresponding to a minimum feature length and a cross-sectional thickness in a second direction orthogonal to the first direction less than the minimum feature length, wherein both the first direction and the second direction are substantially parallel to the surface of the substrate.

3. The method of claim 1, wherein forming a fin of amorphous semiconductor material on a crystalline substrate includes forming a pillar of amorphous silicon on a crystalline silicon substrate.

4. The method of claim 1, wherein forming the surrounding gate insulator includes forming a silicon oxide.

5. The method of claim 1, wherein forming a surrounding gate includes forming a polysilicon gate.

6. A method for forming a transistor, comprising:
    forming a transistor body, including:

forming a fin of amorphous semiconductor material on a crystalline substrate, the fin having a cross-sectional thickness in at least one direction less than a minimum feature size; and performing a solid phase epitaxy (SPE) process to crystallize the amorphous semiconductor material using the crystalline substrate to seed the crystalline growth to transform the fin of amorphous semiconductor material into a crystallized fin, the transistor body being formed in the crystallized fin between a first source/drain region and a second source/drain region;

forming a surrounding gate insulator around the crystallized fin;

forming a surrounding gate around and separated from the crystallized fin by the surrounding gate insulator; and recessing the surrounding gate such that the surrounding gate has a height less than a height of the fin.

7. The method of claim 1, further comprising forming the first source/drain region at a first end of the fin and forming the second source/drain region at a second end of the fin.

8. The method of claim 1, wherein the first source/drain region is beneath the second source/drain region, and a channel region is vertically oriented between the first and second source/drain regions.

9. A method for forming a transistor, comprising:
forming a silicon nitride layer on a silicon wafer;
etching a hole in the silicon nitride, the hole extending through the silicon nitride layer to the silicon wafer and being defined by the sides of the silicon nitride layer;
forming amorphous silicon sidewall spacers on the sides of the silicon nitride that define the hole;
removing the silicon nitride layer, leaving the amorphous silicon sidewall spacers on the silicon wafer;
crystallizing the sidewall spacers;
masking and etching the sidewall spacers to form at least one silicon fin from the sidewall spacers, the silicon fin being positioned over a doped region to function as a first source/drain region for the transistor;
forming a surrounding gate insulator around the silicon fin;
forming a surrounding gate around and separated from the silicon fin by the surrounding gate insulator; and
forming a second source/drain region in a top portion of the silicon fin.

10. The method of claim 9, wherein the height of the silicon fin is less than the minimum feature size.

11. The method of claim 9, wherein the fin has a cross-sectional thickness in a first direction corresponding to a minimum feature length and a cross-sectional thickness in a second direction orthogonal to the first direction less than the minimum feature length.

12. The method of claim 9, wherein forming a surrounding gate insulator around the silicon fins includes performing a thermal oxidation process.

13. The method of claim 9, further comprising patterning and implanting the doped region to function as the first source/drain region before forming the amorphous silicon sidewall spacers.

14. The method of claim 9, wherein forming the surrounding gate includes forming a metal gate.

15. The method of claim 9, wherein forming the surrounding gate includes forming a polysilicon gate.

16. A method for forming an array of transistors, comprising:
forming buried source/drain regions in a silicon wafer;
etching a plurality of holes in a silicon nitride layer on the silicon wafer, the holes extending through the silicon nitride to the silicon wafer, each hole being defined by edges of the silicon nitride layer;
forming amorphous silicon sidewall spacers on the sides of the silicon nitride that define the holes;
removing the silicon nitride layer, leaving the amorphous silicon sidewall spacers on the silicon wafer in a plurality of rectangular tracks;
crystallizing the sidewall spacers;
masking and etching the sidewall spacers to form a plurality of silicon fins from the sidewall spacers, the silicon fins being positioned over the buried source/drain regions;
forming a surrounding gate insulator around each of the silicon fins;
forming a surrounding gate around and separated from each of the silicon fins by the surrounding gate insulator; and
forming a second source/drain region in a top portion of the silicon fins.

17. The method of claim 16, further comprising forming at least one gate line adjacent to and in contact with the surrounding gates for at least two transistors.

18. The method of claim 17, wherein forming at least one gate line includes forming two gate lines adjacent to and in contact with the surrounding gate, the two gate lines being on opposing silicon fins.

19. The method of claim 17, wherein forming at least one gate line includes forming the at least one gate line to contact the surrounding gates in a row of transistors.

20. The method of claim 17, wherein forming at least one gate line includes forming the at least one gate line to contact the surrounding gates in a column of transistors.

* * * * *

UNITED STATES PATENT AND TRADEMARK OFFICE
CERTIFICATE OF CORRECTION

PATENT NO.        : 8,734,583 B2                              Page 1 of 1
APPLICATION NO.   : 11/397430
DATED             : May 27, 2014
INVENTOR(S)       : Forbes It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1518 days.

Signed and Sealed this
Eleventh Day of August, 2015

Michelle K. Lee
*Director of the United States Patent and Trademark Office*